(12) United States Patent
Matsuo et al.

(10) Patent No.: US 12,105,147 B2
(45) Date of Patent: Oct. 1, 2024

(54) RELAY STATE DETERMINATION DEVICE, RELAY STATE DETERMINATION SYSTEM, RELAY STATE DETERMINATION METHOD, AND PROGRAM

(71) Applicant: OMRON Corporation, Kyoto (JP)

(72) Inventors: Shinya Matsuo, Yamaga (JP); Takuya Yamazaki, Kyoto (JP)

(73) Assignee: OMRON CORPORATION, Kyoto (JP)

( * ) Notice: Subject to any disclaimer, the term of this patent is extended or adjusted under 35 U.S.C. 154(b) by 323 days.

(21) Appl. No.: 17/311,901

(22) PCT Filed: Nov. 21, 2019

(86) PCT No.: PCT/JP2019/045579
§ 371 (c)(1),
(2) Date: Jun. 8, 2021

(87) PCT Pub. No.: WO2020/121768
PCT Pub. Date: Jun. 18, 2020

(65) Prior Publication Data
US 2022/0026491 A1    Jan. 27, 2022

(30) Foreign Application Priority Data
Dec. 10, 2018 (JP) .................................. 2018-230735

(51) Int. Cl.
 *G01R 31/327* (2006.01)
 *H01H 47/00* (2006.01)
 *H01H 71/04* (2006.01)

(52) U.S. Cl.
 CPC ....... *G01R 31/3278* (2013.01); *H01H 47/002* (2013.01); *H01H 71/04* (2013.01); *H01H 2071/044* (2013.01)

(58) Field of Classification Search
 CPC .. G01R 31/3278; H01H 47/002; H01H 71/04; H01H 71/044
 See application file for complete search history.

(56) References Cited

U.S. PATENT DOCUMENTS 6,657,833 B2 * 12/2003 Matsuki ................. B23K 31/02
 361/23
9,097,766 B2 * 8/2015 Kodama ............. G01R 31/327
(Continued)

FOREIGN PATENT DOCUMENTS

| CN | 104345267 A | 2/2015 |
| JP | S57199963 A | 12/1982 |

(Continued)

OTHER PUBLICATIONS

International Search Report for International Application No. PCT/JP2019/045579; Date of Mailing, Jul. 1, 2020.
(Continued)

*Primary Examiner* — Walter L Lindsay, Jr.
*Assistant Examiner* — Milton Gonzalez
(74) *Attorney, Agent, or Firm* — CANTOR COLBURN LLP (57) ABSTRACT

A relay state determination device includes a voltage value acquisition unit, a contact bounce time acquisition unit, and a state determination unit. The voltage value acquisition unit acquires a voltage value between one pair of contacts mutually opened and closed in a relay. The contact bounce time acquisition unit obtains a contact bounce time indicated by the one pair of contacts based on the temporal change in the voltage value after the ON instruction to the relay. The state determination unit compares the contact bounce time with a time threshold value to determine whether or not the relay 4 has deteriorated.

5 Claims, 6 Drawing Sheets

(56) References Cited

U.S. PATENT DOCUMENTS

| | | | |
|---|---|---|---|
| 9,117,609 B2 * | 8/2015 | Kodama | H01H 1/0015 |
| 9,711,309 B2 * | 7/2017 | McCormick | H01H 50/00 |
| 2011/0228438 A1 | 9/2011 | Kohri et al. | |
| 2011/0241692 A1 | 10/2011 | Akita et al. | |

FOREIGN PATENT DOCUMENTS

| | | | |
|---|---|---|---|
| JP | 06243768 A * | 9/1994 | |
| JP | H11316262 A | 11/1999 | |
| JP | 2009101946 A | 5/2009 | |
| JP | 2011210546 A | 10/2011 | |
| JP | 2011215131 A | 10/2011 | |
| KR | 2014069947 A * | 6/2014 | |

OTHER PUBLICATIONS

PCT Written Opinion of the International Searching Authority for International Application No. PCT/JP2019/045579; Date of mailing, Jul. 1, 2020.

Ren Li, "Study on Reliability Life Test Analysis System for Aerospace Relay-CNKI"; China Academic Journals (CD Edition) Electronic Publishing House Co., Ltd., Nov. 16, 2011—Dec. 15, 2011. <http://www.cnki.net>; 12 pages with English abstract.

SIPO First Examination Opinion Notice for corresponding CN Application No. 201980077826.9; Issued Jan. 28, 2024; 22 pages.

* cited by examiner

RELAY STATE DETERMINATION DEVICE, RELAY STATE DETERMINATION SYSTEM, RELAY STATE DETERMINATION METHOD, AND PROGRAM

CROSS REFERENCE TO RELATED APPLICATIONS

This is the U.S. national stage of application No. PCT/JP2019/045579, filed on Nov. 21, 2019. Priority under 35 U.S.C. § 119(a) and 35 U.S.C. § 365(b) is claimed from Japanese Application No. 2018-230735 filed Dec. 10, 2018, the disclosure of which is also incorporated herein by reference.

TECHNICAL FIELD

The present invention relates to a relay state determination device, a relay state determination system, a relay state determination method, and a program, and, for example, relates to a relay state determination device, a relay state determination system, a relay state determination method, and a program which are capable of determining whether or not a relay of a type that opens and closes contacts on a secondary side by turning on and off energization of a coil on a primary side has deteriorated.

BACKGROUND ART

Conventionally, there has been a technique for predicting a failure of a relay. For example, Patent Document 1 (JP 2011-210546 A) discloses a technique for diagnosing the life of a relay based on an operating time and a recovery time.

SUMMARY OF THE INVENTION

A relay state determination device according to the present embodiment is a relay state determination device configured to determine whether or not a relay of a type configured to open and close contacts on a secondary side by turning on and off energization of a coil on a primary side has deteriorated, the relay state determination device including: a voltage value acquisition unit configured to acquire a voltage value between one pair of contacts mutually opened and closed in the relay; a contact bounce time acquisition unit configured to obtain a contact bounce time indicated by the one pair of contacts based on a temporal change in the voltage value after an ON instruction to the relay; and a state determination unit configured to compare the contact bounce time with a time threshold value set in advance to determine whether or not the relay has deteriorated.

DESCRIPTION OF THE EMBODIMENTS

Hereinafter, embodiments of the present invention will be described in detail with reference to the drawings.

(Schematic Configuration of Relay State Determination System 100)

Figure 1:
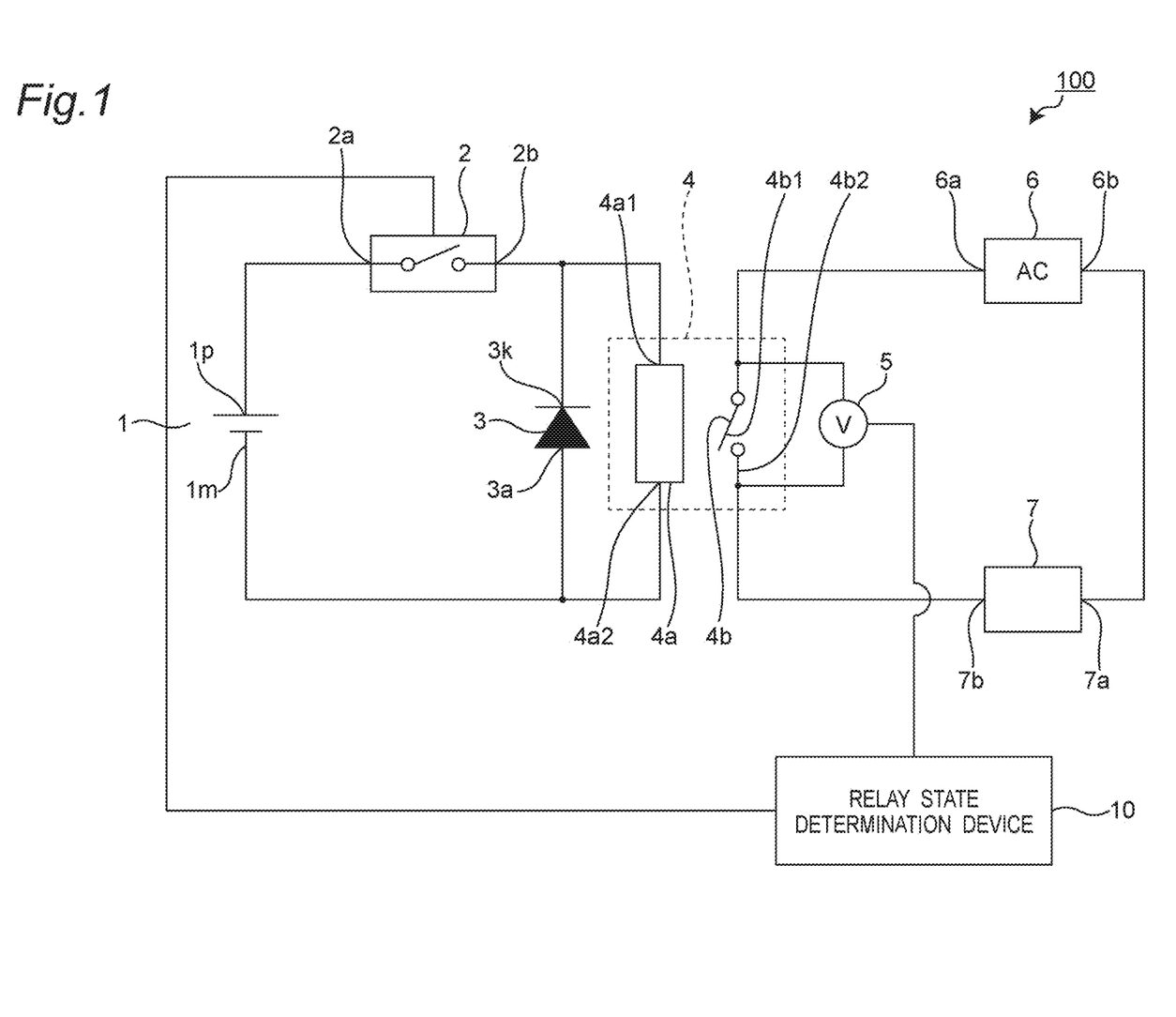
FIG. 1 is a diagram showing a schematic configuration of a relay state determination system according to an embodiment.

The overall configuration of the relay state determination system 100 will be described. FIG. 1 shows, as an example, a schematic circuit configuration of the relay state determination system 100 according to the embodiment. The relay state determination system 100 determines whether or not a relay 4 has deteriorated. Here, the "deterioration" of the relay 4 is a state of the relay 4 in which the opening/closing operation of the relay 4 may not be performed normally, in other words, there may be a failure. For example, despite the closing operation of the relay 4 being instructed, the state where the contacts 4$b$1 and 4$b$2 do not contact each other, the state where the contacts 4$b$1 and 4$b$2 are welded to each other, or the like means the deterioration of the relay 4.

As shown in FIG. 1, the relay state determination system 100 includes the relay 4, a voltmeter 5, and a relay state determination device 10. In addition, the relay state determination system 100 further includes a DC power supply 1, a switch device 2, a diode 3, an AC power supply 6, and a load 7.

As shown in FIG. 1, the relay 4 is arranged to straddle a primary side circuit and a secondary side circuit. The relay 4 includes a coil 4$a$ on the primary side and a switch 4$b$ on the secondary side. In addition, the switch 4$b$ on the secondary side includes a pair of contacts on the secondary side (first contact 4$b$1 and second contact 4$b$2). The pair of contacts 4$b$1 and 4$b$2 open and close by turning on/off the energization of the coil 4$a$ on the primary side.

As shown in FIG. 1, in the primary side circuit, a positive electrode terminal 1$p$ of the DC power supply 1 is connected to one end 2$a$ of the switch device 2. The other end 2$b$ of the switch device 2 is connected to the cathode terminal 3$k$ of the diode 3. In addition, the other end 2$b$ of the switch device 2 is connected to one end 4$a$1 of a coil 4. A negative electrode terminal 1$m$ of the DC power supply 1 is connected to an anode terminal 3$a$ of the diode 3. In addition, the negative electrode terminal 1$m$ of the DC power supply 1 is connected to the other end 4$a$2 of the coil 4.

As shown in FIG. 1, in the secondary side circuit, the first contact 4$b$1 of the switch 4$b$ is connected to one end 6$a$ of the AC power supply 6 being a load power supply. The other end 6$b$ of the AC power supply 6 is connected to one end 7$a$ of the load 7. The other end 7$b$ of the load 7 is connected to the second contact 4$b$2 of the switch 4$b$. It should be noted that the voltmeter 5 is connected in parallel to the switch 4$b$. Thus, the voltmeter 5 can measure the voltage value between the one pair of contacts 4$b$1 and 4$b$2 of the relay 4.

The relay state determination device 10 is arranged separately from the primary side circuit and the secondary side circuit described above. As shown in FIG. 1, the relay state determination device 10 is communicably connected to the voltmeter 5. It should be noted that the connection between the relay state determination device 10 and the voltmeter 5 may be wired or wireless. With this configuration, the relay state determination device 10 can receive a voltage value being the measurement result of the voltmeter 5, from the voltmeter 5. In addition, the relay state determination device 10 is communicably connected to the switch device 2. It should be noted that the connection between the relay state determination device 10 and the switch device 2 may be wired or wireless. With this configuration, the switch device 2 can notify the relay state determination device 10 of the on timing (time point) of the switch device 2 and the off timing (time point) of the switch device 2.

The DC power supply 1 supplies a DC current to the coil 4a in the relay 4. The switch device 2 switches from the ON state of the switch to the OFF state of the switch and from the OFF state of the switch to the ON state of the switch in response to a switch control signal from the outside (not shown). It should be noted that the switch device 2 transmits a signal indicating the switching timing (time point) to the relay state determination device 10. The diode 3 is arranged to protect the circuit from the counter electromotive voltage generated by the coil 4a being an inductive load.

As described above, in the relay 4, the one pair of contacts 4b1 and 4b2 on the secondary side are opened and closed by turning on and off the energization of the coil 4a on the primary side. More specifically, switching the switch device 2 on turns on the energization of the coil 4a from the DC power supply 1. Then, the relay 4 (more specifically, the switch 4b) is "closed" by energizing the coil 4a. On the other hand, switching the switch device 2 off turns off the energization of the coil 4a from the DC power supply 1. Then, the relay 4 (more specifically, the switch 4b) is "opened" by de-energizing the coil 4a.

The switch 4b in the relay 4 includes the first contact 4b1 and the second contact 4b2. The voltmeter 5 measures the voltage value between the first contact 4b1 and the second contact 4b2. The voltmeter 5 transmits the measured voltage value as a signal to the relay state determination device 10. The AC power supply 6 supplies AC power to the load 7. Then, the load 7 consumes the supplied AC power and performs a predetermined operation.

(Schematic Configuration of Relay State Determination Device 10)

Figure 2:
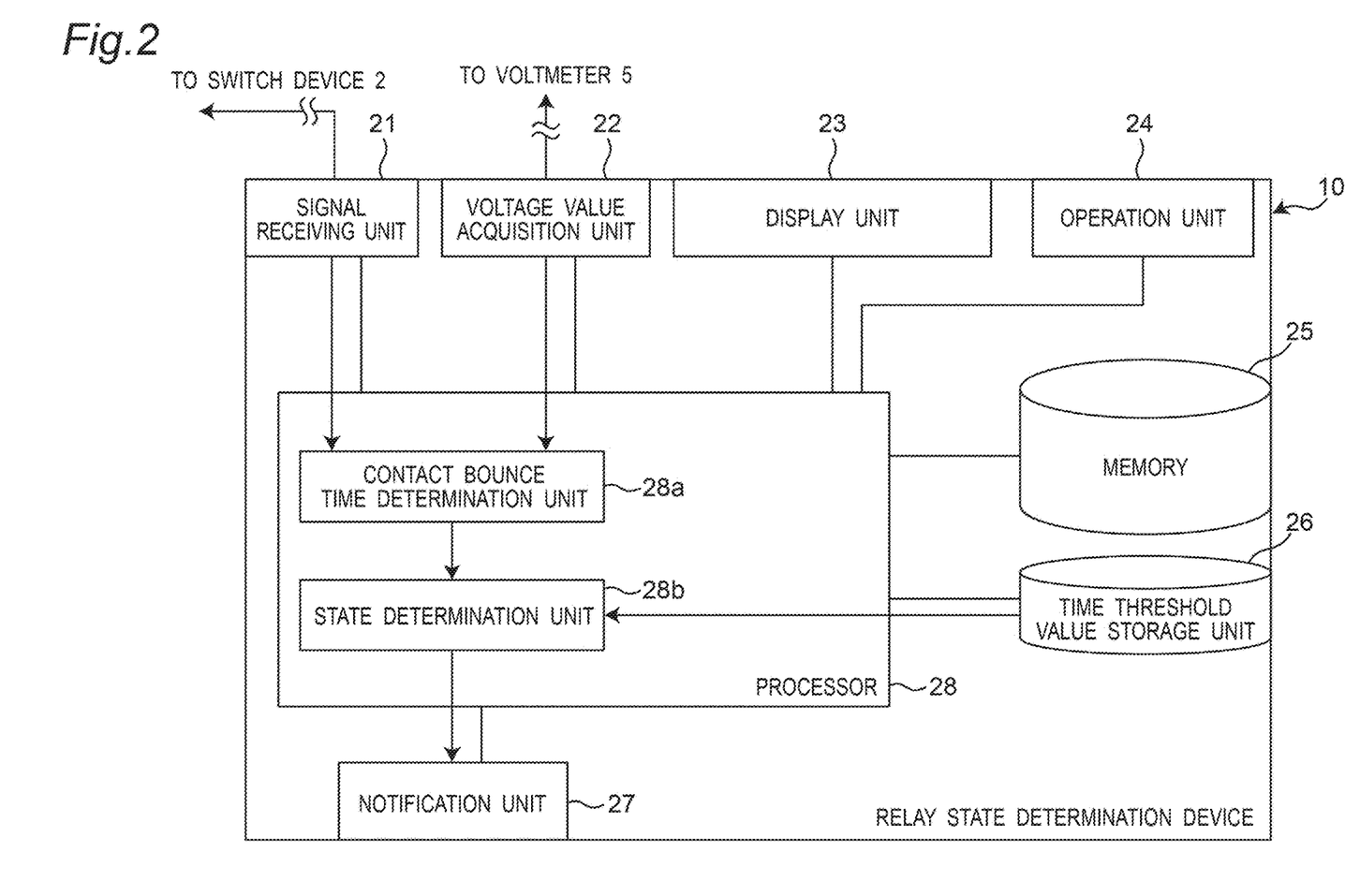
FIG. 2 is a diagram showing a block configuration of a relay state determination device included in the relay state determination system in FIG. 1.

Next, the configuration of the relay state determination device 10 will be described. FIG. 2 shows a schematic configuration of the relay state determination device 10. In the present embodiment, the relay state determination device 10 determines whether or not the above-described relay 4 has deteriorated. As shown in FIG. 2, the relay state determination device 10 includes a signal receiving unit 21, a voltage value acquisition unit 22, a display unit 23, an operation unit 24, a memory 25, a time threshold value storage unit 26, a notification unit 27, and a processor 28.

In the relay state determination device 10, the processor 28 is communicably connected to the signal receiving unit 21, the voltage value acquisition unit 22, the display unit 23, the operation unit 24, the memory 25, the time threshold value storage unit 26, and the notification unit 27. Thus, the processor 28 controls the signal receiving unit 21, the voltage value acquisition unit 22, the display unit 23, the operation unit 24, the memory 25, the time threshold value storage unit 26, and the notification unit 27. With the control, each unit 21, 22, 23, 24, 25, 26, and 27 performs a predetermined operation.

The signal receiving unit 21 transmits/receives a signal or data to/from an external terminal. For example, the signal receiving unit 21 according to the present embodiment is communicably connected to the switch device 2. Therefore, the signal receiving unit 21 receives data indicating the timing (time point) when the switch device 2 is turned on, data indicating the timing (time point) when the switch device 2 is turned off, and the like from the switch device 2.

The voltage value acquisition unit 22 transmits/receives a signal or data to/from an external terminal. For example, the voltage value acquisition unit 22 according to the present embodiment is communicably connected to the voltmeter 5. Therefore, the voltage value acquisition unit 22 receives (acquires) a signal representing the voltage value measured by the voltmeter 5 from the voltmeter 5. As described above, the voltage value is the potential difference between the one pair of contacts 4b1 and 4b2 mutually opened and closed of the relay 4.

The display unit 23 is a monitor that displays various images. The display unit 23 can visually recognizably display the results and the like of various analyses in the processor 28. In addition, the display unit 23 can visually recognizably display predetermined information in response to an instruction from the user via the operation unit 24. For example, the display unit 23 may visually recognizably display the information (data) stored in the memory 25 and the time threshold value storage unit 26. In addition, the display unit 23 may visually recognizably display a predetermined notification or the like. For example, a liquid crystal monitor or the like can be adopted as the display unit 23.

The operation unit (which can be grasped as a time threshold value input unit) 24 is a unit that accepts a predetermined operation (instruction) from the user. For example, the operation unit 24 is composed of a mouse, a keyboard, and the like. Here, when a touch panel type monitor is adopted as the display unit 23, the display unit 23 has not only a display function but also a function as the operation unit 24.

The memory 25 stores various kinds of data. The memory 25 includes RAM (Random Access Memory), ROM (Read Only Memory), and the like. For example, various programs used for the operation of the processor 28 and the like are changeably stored in the memory 25. In addition, the memory 25 stores data from the switch device 2 acquired by the signal receiving unit 21 (data indicating the switching timing), voltage value data from the voltmeter 5 acquired by the voltage value acquisition unit 22, and the like. The memory 25 may erase the stored various kinds of data after a predetermined time set in advance has elapsed after the storage.

The time threshold value storage unit 26 stores a time threshold value Tth. Here, the time threshold value Tth is determined (set) by the user based on an empirical rule or the like. It should be noted that the time threshold value Tth stored in the time threshold value storage unit 26 can be changed. For example, the operation unit 24 functions as the time threshold value input unit for variably inputting the time threshold value Tth. The user inputs a desired time threshold value Tth into the operation unit 24. Thus, the time threshold value Tth is stored (set) in the time threshold value storage unit 26. It should be noted that when a time threshold value Tth' is already stored in the time threshold value storage unit 26, the time threshold value Tth' is changed to the time threshold value Tth corresponding to the operation by the operation via the operation unit 24 from the user. It should be noted that the time threshold value storage unit 26 may have a predetermined time threshold value Tth as default.

The notification unit 27 notifies that the relay 4 has deteriorated based on the analysis result of the processor 28 described later. For example, when the notification unit 27 includes a speaker or the like, the notification unit 27 outputs a predetermined sound. In addition, for example, when the notification unit 27 includes a member that outputs predetermined light, the notification unit 27 outputs the predetermined light. It should be noted that the display unit 23 can be caused to have the function of the notification unit 27, and in this case, predetermined information (information indicating deterioration of the relay 4) is visually recognizably displayed on the display unit 23.

The processor 28 includes a CPU (Central Processing Unit). For example, the processor 28 reads each program and each piece of data stored in the memory 25. In addition, the processor 28 controls each of the units 21 to 27 according to the read program to cause each of the units 21 to 27 to execute a predetermined operation (function). In addition, the processor 28 performs a predetermined calculation, analysis, processing, and the like in the processor 28 (each of blocks 28a and 28b composed of the program) according to the read program. It should be noted that a part or the whole of each function executed by the processor 28 may be configured in hardware with one or more integrated circuits or the like.

As shown in FIG. 2, the processor 28 according to the present embodiment includes the contact bounce time determination unit 28a and the state determination unit 28b programmed to achieve a predetermined operation as functional blocks. It should be noted that the operation of each of the blocks 28a and 28b will be described in detail in the description of the operations described below.

(Operation of Relay State Determination System 100)

Next, the operation of determining whether or not the relay 4 has deteriorated in the relay state determination system 100 will be described with reference to the flowchart shown in FIG. 3.

Figure 3:
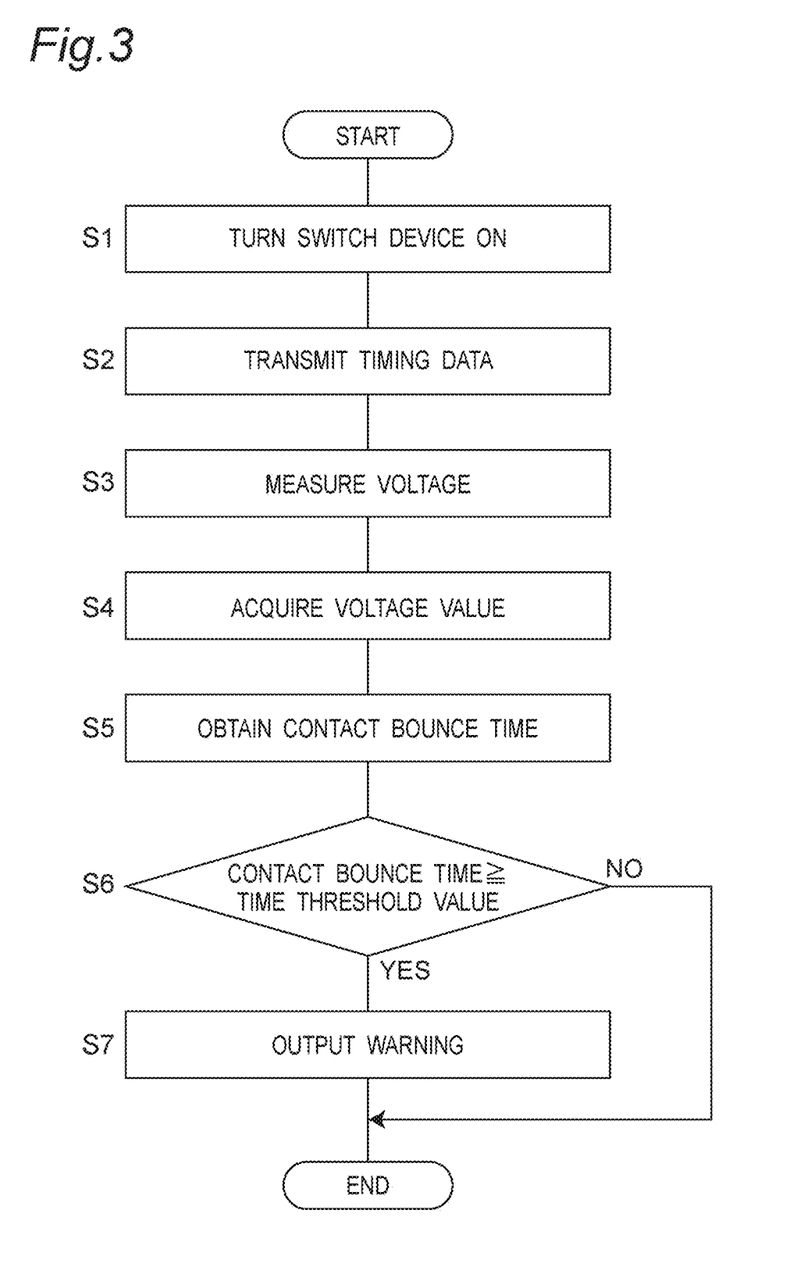
FIG. 3 is a flowchart illustrating the operation of the relay state determination system in FIG. 1.

With reference to FIG. 3, it is assumed that the switch device 2 has been switched from the OFF state to the ON state (step S1). The switch device 2 transmits the switching time point to the relay state determination device 10 as timing data (step S2). The signal receiving unit 21 of the relay state determination device 10 receives the transmitted timing data. It should be noted that the memory 25 stores the timing data received by the signal receiving unit 21.

On the other hand, the voltmeter 5 measures the voltage between the first contact 4b1 and the second contact 4b2 at the switch 4 (step S3). Then, the voltmeter 5 transmits the voltage value being the measurement result to the relay state determination device 10, and the voltage value acquisition unit 22 of the relay state determination device 10 receives the voltage value (step S4). The memory 25 stores the voltage value received by the voltage value acquisition unit 22. Here, the voltmeter 5 may constantly measure the voltage value between the one pair of contacts 4b1 and 4b2. Alternatively, the voltmeter 5 may start the voltage value measurement at substantially the same timing as the time point of the switch device 2 switching to the ON state.

Next, the contact bounce time acquisition unit 28a of the processor 28 obtains a contact bounce time Tb indicated by the one pair of contacts 4b1 and 4b2 (step S5). Specifically, the contact bounce time acquisition unit 28a obtains the contact bounce time Tb based on the temporal change in the voltage value between the contacts 4b1 and 4b2 after the ON instruction to the relay 4 (after step S1). The contact bounce time Tb is a time period during which when the energization of the coil 4a1 on the primary side of the relay 4 is turned on, the opening and closing phenomenon between the contacts caused by the mutual collision between the contacts 4b1 and 4b2 that are about to close on the secondary side continues intermittently.

Figure 4:
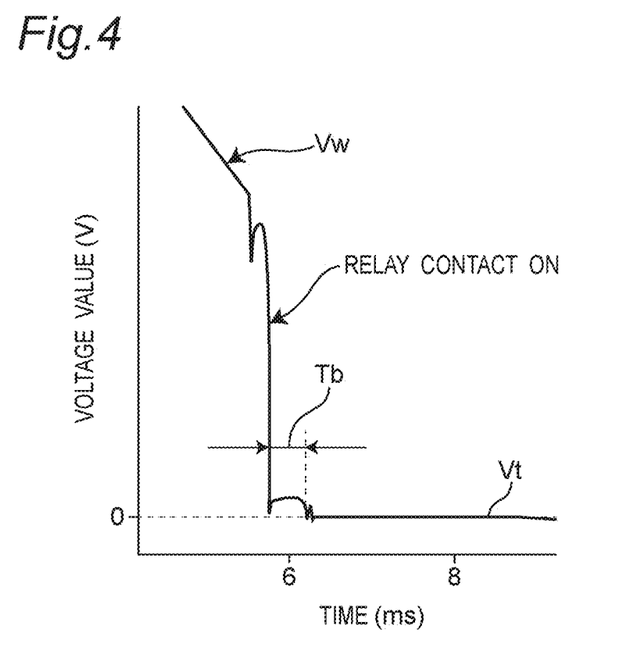
FIG. 4 is a diagram illustrating a voltage waveform when a relay is new.

Here, FIG. 4 shows the temporal change in the voltage value between the contacts 4b1 and 4b2 after the ON instruction to the relay 4 (after step S1). The vertical axis in FIG. 4 is the voltage value (V) between the contacts 4b1 and 4b2, and the horizontal axis in FIG. 4 is the time (ms). The contact bounce time determination unit 28a reads from the memory 25 the voltage value between the contacts 4b1 and 4b2 after the ON instruction to the relay 4 (after step S1). Thus, the contact bounce time determination unit 28a can generate a graph (voltage waveform Vw) showing the temporal change in the voltage value between the contacts 4b1 and 4b2 after the ON instruction to the relay 4 (after step S1), which is illustrated in FIG. 4.

The contact bounce time determination unit 28a obtains the contact bounce time Tb based on the voltage waveform Vw illustrated in FIG. 4. For example, the contact bounce time determination unit 28a first detects a voltage region Vt in which the voltage value is continuously 0 V for a predetermined time after the ON instruction to the relay 4, in the voltage waveform Vw. Then, the contact bounce time determination unit 28a determines the time from after the ON-instruction to the relay 4 to the beginning time point of the detected voltage region Vt as the contact bounce time Tb (see FIG. 4).

Figure 5:
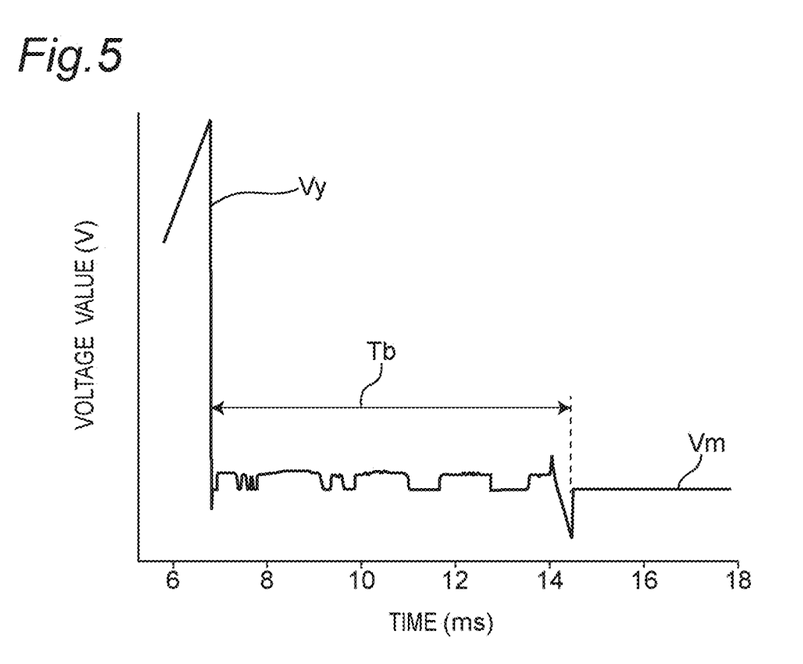
FIG. 5 is a diagram illustrating a voltage waveform when the relay is used for a long period of time.

It should be noted that FIG. 4 illustrates the voltage waveform Vw when the relay 4 is new. FIG. 5 illustrates a voltage waveform Vy in the relay 4 that has been used for a long period of time. In the voltage waveform Vy illustrated in FIG. 5, 0 V is observed multiple times after the ON instruction to the relay 4. However, the period of 0 V observed before a voltage region Vm is less than the above-described predetermined time. Therefore, when the contact bounce time Tb is to be obtained, the voltage region of 0 V over a period shorter than the predetermined time is not used. In the example in FIG. 5, in the voltage waveform Vy, the portion where the voltage value is first continuously 0 V for a predetermined time after the ON instruction to the relay 4 is the voltage region Vm. Therefore, in the example in FIG. 5, the contact bounce time determination unit 28a determines the time from after the ON-instruction to the relay 4 to the beginning time point of the detected voltage region Vm as the contact bounce time Tb (see FIG. 5).

It should be noted that the contact bounce time Tb may be obtained by the user. For example, the contact bounce time determination unit 28a creates the voltage waveforms Vw and Vy illustrated in FIGS. 4 and 5. Thereafter, the display unit 23 displays the voltage waveforms Vw and Vy under the control of the processor 28. The user refers to the voltage waveforms Vw and Vy displayed on the display unit 23, and determines the contact bounce time Tb based on the voltage waveforms Vw and Vy.

Next, in step S6 in FIG. 3, the contact bounce time determination unit 28a transmits the contact bounce time Tb to the state determination unit 28b. The state determination unit 28b reads the time threshold value Tth stored in the time threshold value storage unit 26. Then, the state determination unit 28b compares the contact bounce time Tb with the time threshold value Tth to determine whether or not the relay 4 has deteriorated (step S6).

Here, as can be seen from the above, the contact bounce time used in the comparison processing in step S6 is the contact bounce time Tb obtained in step S5. In addition, the time threshold value used in the comparison processing in step S6 is the time threshold value Tth set in advance in the time threshold value storage unit 26 of the relay state determination device 10.

Figure 6:
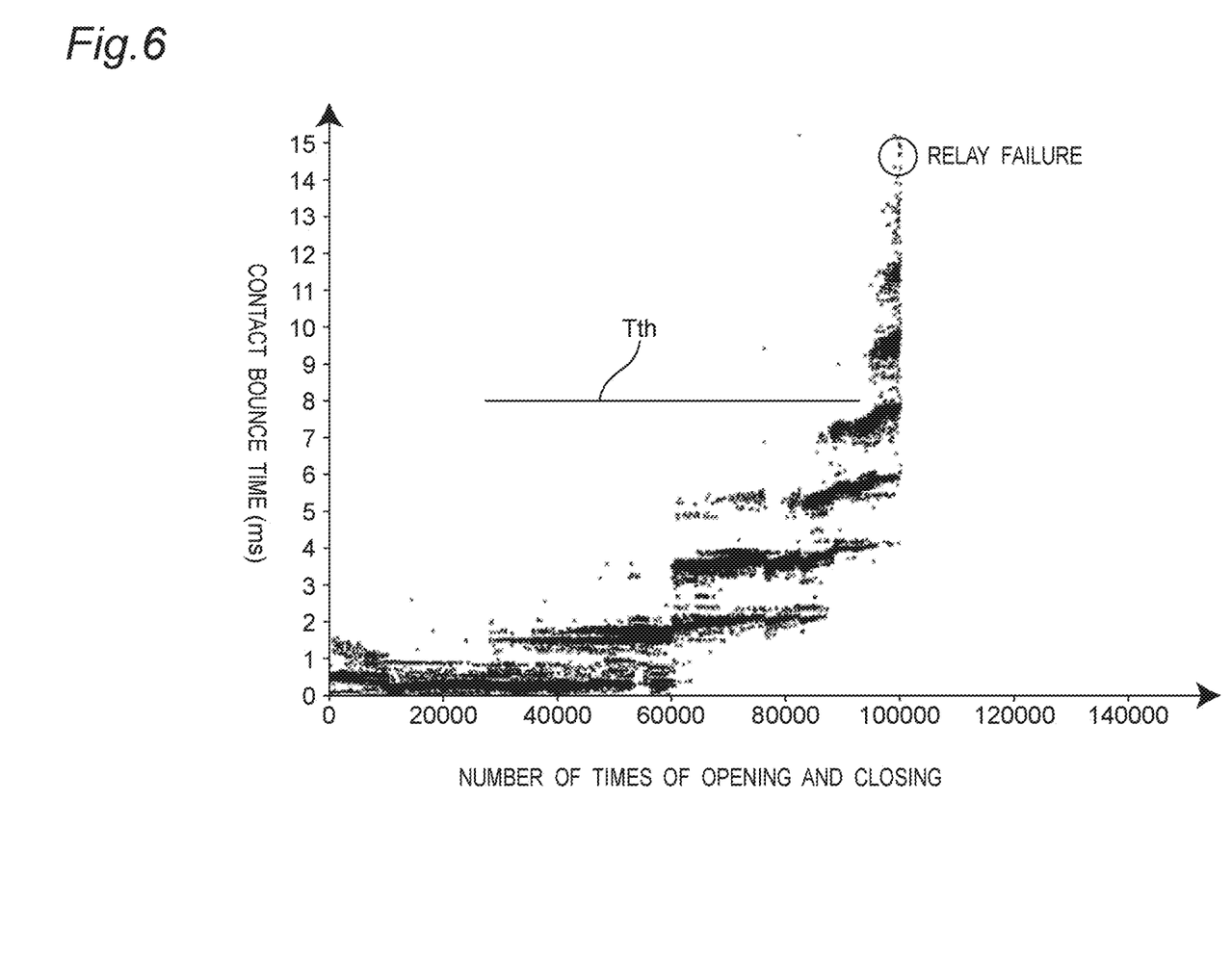
FIG. 6 is a diagram illustrating the relationship between a contact bounce time and the number of times of opening and closing of the relay.

As described above, the time threshold value Tth is set by the user based on an empirical rule or the like. FIG. 6 illustrates the relationship between the contact bounce time Tb and the number of times of opening and closing of the contacts 4b1 and 4b2. The vertical axis in FIG. 6 is the contact bounce time Tb (second), and the horizontal axis in FIG. 6 is the number of times of opening and closing of the contacts 4b1 and 4b2. As illustrated in FIG. 6, in general, as the number of times of opening and closing of the relay 4 increases, the contact bounce time Tb gradually increases. The user takes into account the measurement results of the contact bounce time illustrated in FIG. 6, the usage state of the relay 4, the expected time point of failure of the relay 4 (the time point when the opening and closing of the relay 4 is expected not to operate normally), and the like to set the time threshold value Tth based on the empirical rule. It should be noted that in the example in FIG. 6, the time threshold value Tth is set to 8 ms. That is, in the example in FIG. 6, the user considers each of the above factors, and determines that the relay 4 has deteriorated when the contact bounce time Tb of the relay 4 to be used is 8 ms or more.

Specifically, in step S6 in FIG. 3, the state determination unit 28b determines whether or not the contact bounce time Tb is the time threshold value Tth or more. It is assumed that the state determination unit 28b determines that the contact bounce time Tb is less than the time threshold value Tth ("NO" in step S6). In this case, as shown in FIG. 3, the relay state determination processing ends.

On the other hand, it is assumed that the state determination unit 28b determines that the contact bounce time Tb is the time threshold value Tth or more ("YES" in step S6). In this case, the state determination unit 28b controls the notification unit 27, and the notification unit 27 notifies that the relay 4 has deteriorated (step S7). Thereafter, the relay state determination processing ends.

It should be noted that the state determination unit 28b may determine the deterioration of the relay 4 based on not only the comparison between the contact bounce time Tb and the time threshold value Tth, but also the voltage waveform indicating the temporal change in the voltage value between the contacts 4b1 and 4b2.

[Effect]

Figure 7:
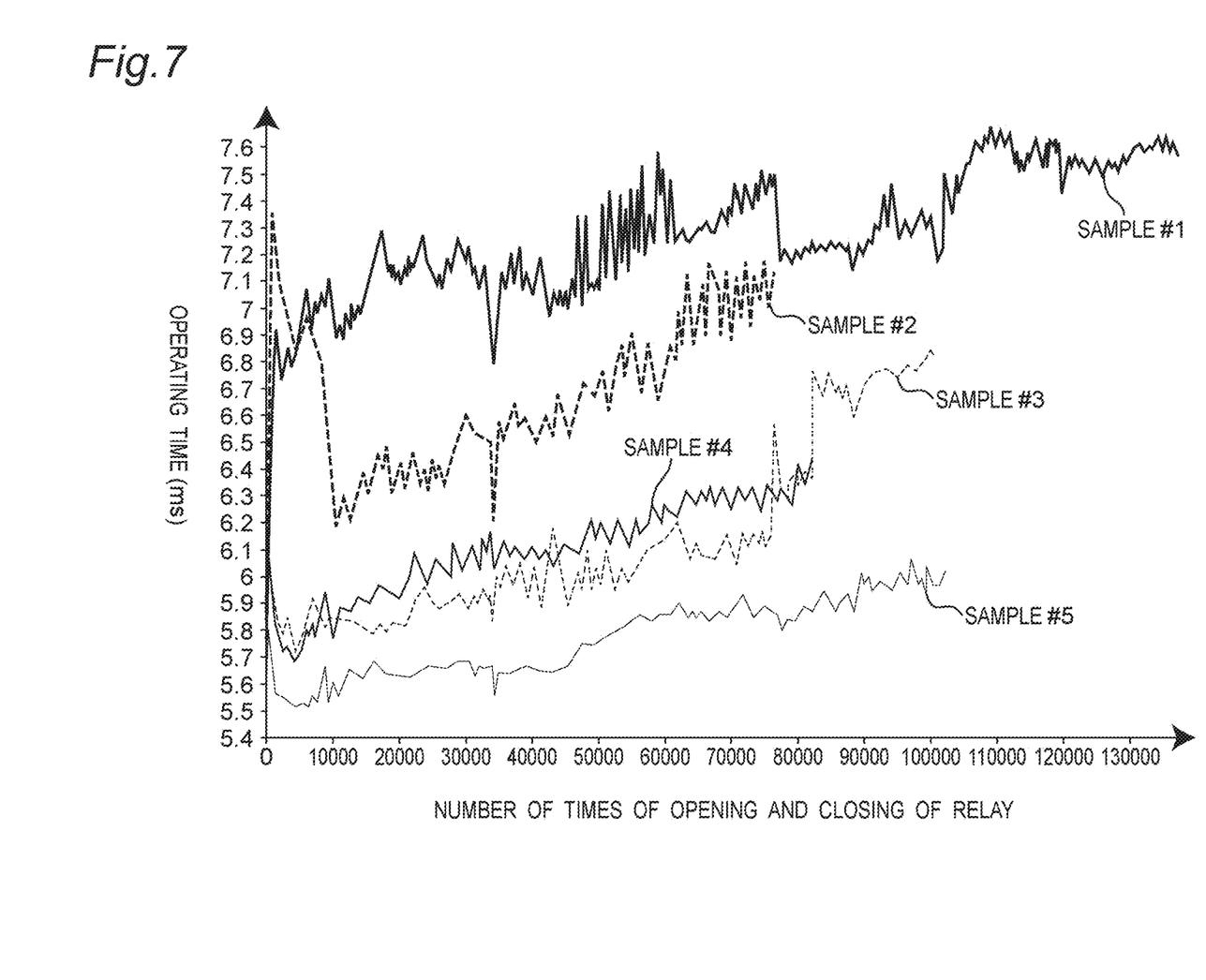
FIG. 7 is a diagram showing the relationship between an operating time of the relay and the number of times of opening and closing of the relay for each of a plurality of samples.

As described in the related art, when the life of a relay is diagnosed based on the operating time or the like of the relay, there has been a problem that the accuracy of determining whether or not the relay has deteriorated is lowered. FIG. 7 shows one experimental data illustrating the relationship between the operating time of the relay and the number of times of opening and closing of the relay. Samples #1 to #5 shown in FIG. 7 are relays of the same type (model number) and are tested under the same conditions. As can be seen from the experimental example in FIG. 7, even if the relays are of the same type (model number), there are large individual differences in terms of operating time and the like. Therefore, it is difficult to predict the life of a relay based on the operating time of the relay or the like.

On the other hand, in the present embodiment, the contact bounce time acquisition unit 28a obtains the contact bounce time Tb after the contact ON instruction to the relay 4. Then, the state determination unit 28b compares the contact bounce time Tb with the time threshold value Tth, and determines whether or not the relay 4 has deteriorated. Here, it is empirically known that the individual difference of the relay 4 is small in terms of the contact bounce time of the relay 4. Therefore, according to the present embodiment, it is possible to accurately determine whether or not the relay 4 has deteriorated.

In addition, in the present embodiment, if it is determined that the contact bounce time Tb is the time threshold value Tth or more ("YES" in step S6), the notification unit 27 notifies that the relay 4 has deteriorated. Therefore, the user can quickly take countermeasures such as replacing the relay 4.

In addition, in the present embodiment, the operation unit (time threshold value input unit) 24 for variably inputting the time threshold value Tth is further included. Therefore, the user can appropriately set an appropriate time threshold value Tth, for example, according to a change in the usage state of the relay 4.

Software (computer program) for causing a computer to execute the above-described relay state determination method (FIG. 3) may be recorded on a recording media that can store data non-transitorily, such as a CD (compact disc), a DVD (digital universal disc), and a flash memory. Installing the software recorded on such a recording medium on practical computer apparatuses such as a personal computer, a personal digital assistant (PDA), and a smartphone can cause those computers to execute the above-described relay state determination method.

In addition, in the above-described embodiment, the processor 28 includes a CPU, but the present invention is not limited to this. The processor 28 may include a logic circuit (integrated circuit) such as a PLD (Programmable Logic Device) and an FPGA (Field Programmable Gate Array).

The above embodiments are illustrative, and various modifications can be made without departing from the scope of the present invention. Each of the plurality of embodiments described above can be established independently, but a combination of the embodiments is also possible. In addition, various characteristics in different embodiments can be independently established, but a combination of characteristics in different embodiments is also possible.

In the present specification, the "contact bounce time" is a time period during which when the energization of the coil on the primary side of the relay is turned on, the opening and closing phenomenon between the contacts caused by the mutual collision between the contacts that are about to close on the secondary side continues intermittently.

The "deterioration" of the relay is a state of the relay in which the opening/closing operation of the relay may not be performed normally, in other words, there may be a failure.

In the relay state determination device of the present embodiment, the voltage value acquisition unit acquires the voltage value between the one pair of contacts mutually opened and closed in the relay. The contact bounce time acquisition unit obtains the contact bounce time indicated by the one pair of contacts based on the temporal change in the voltage value after the contact ON instruction to the relay. The state determination unit compares the contact bounce time with the time threshold value set in advance to determine whether or not the relay has deteriorated. Here, it is empirically known that the individual difference of the relay is small in terms of the contact bounce time of the relay. Therefore, according to this relay state determination device, it is possible to accurately determine whether or not the relay has deteriorated.

The relay state determination device of one embodiment further includes a notification unit configured to notify that the relay has deteriorated when it is determined that the contact bounce time is the time threshold value or more.

With the relay state determination device of the one embodiment, the user can recognize that the relay has deteriorated by receiving the above notification. Therefore, the user can quickly take countermeasures such as replacing the relay.

The relay state determination device of one embodiment further includes a time threshold value input unit for variably inputting the time threshold value.

In the relay state determination device of the one embodiment, the time threshold value can be variably set by the input through the time threshold value input unit. Therefore, the user can appropriately set an appropriate time threshold value, for example, according to a change in the usage state of the relay.

In another aspect, a relay state determination system of this disclosure is a relay state determination system configured to determine whether or not a relay has deteriorated, the relay state determination system including: a relay including a coil on a primary side, and one pair of contacts on a secondary side configured to open and close by turning on and off energization of the coil on the primary side; a voltmeter configured to measure a voltage value between the one pair of contacts of the relay; and a relay state determination device communicably connected to the voltmeter. The relay state determination device includes a voltage value acquisition unit configured to acquire the voltage value from the voltmeter, a contact bounce time acquisition unit configured to obtain a contact bounce time indicated by the one pair of contacts based on a temporal change in the voltage value after an ON instruction to the relay, and a state determination unit configured to compare the contact bounce time with a time threshold value set in advance to determine whether or not the relay has deteriorated.

In the relay state determination system of the present embodiment, the voltmeter measures the voltage value between the one pair of contacts of the relay. Then, in the relay state determination device, the voltage value acquisition unit acquires the voltage value between the one pair of contacts mutually opened and closed in the relay. The contact bounce time acquisition unit obtains the contact bounce time indicated by the one pair of contacts based on the temporal change in the voltage value after the contact ON instruction to the relay. The state determination unit compares the contact bounce time with the time threshold value set in advance to determine whether or not the relay has deteriorated. Here, it is empirically known that the individual difference of the relay is small in terms of the contact bounce time of the relay. Therefore, according to this relay state determination system, it is possible to accurately determine whether or not the relay has deteriorated.

In another aspect, a relay state determination method of this disclosure is a relay state determination method for determining whether or not a relay of a type configured to open and close contacts on a secondary side by turning on and off energization of a coil on a primary side has deteriorated, the relay state determination method including: acquiring a voltage value between one pair of contacts mutually opened and closed in the relay; obtaining a contact bounce time indicated by the one pair of contacts based on a temporal change in the voltage value after an ON instruction to the relay; and comparing the contact bounce time with a time threshold value set in advance to determine whether or not the relay has deteriorated.

In the relay state determination method of the present embodiment, the voltage value between the one pair of contacts mutually opened and closed in the relay is acquired. Then, the contact bounce time indicated by the one pair of contacts is obtained based on the temporal change in the voltage value after the contact ON instruction to the relay. Then, the contact bounce time is compared with the time threshold value set in advance, and it is determined whether or not the relay has deteriorated. Here, it is empirically known that the individual difference of the relay is small in terms of the contact bounce time of the relay. Therefore, according to this relay state determination method, it is possible to accurately determine whether or not the relay has deteriorated.

In still another aspect, a program of this disclosure is a program for causing a computer to execute the relay state determination method.

The above relay state determination method can be implemented by causing the computer to execute the program of this disclosure.

EFFECTS OF THE EMBODIMENTS

As is clear from the above, according to the relay state determination device, the relay state determination system, and the relay state determination method of this disclosure, it is possible to accurately determine whether or not the relay has deteriorated. In addition, the above relay state determination method can be implemented by causing the computer to execute the program of this disclosure.

The invention claimed is:

1. A relay state determination device configured to determine whether or not a relay of a type configured to open and close contacts on a secondary side by turning on and off energization of a coil on a primary side has deteriorated, the relay state determination device comprising:
   a voltage value acquisition unit configured to acquire a voltage value between one pair of contacts mutually opened and closed in the relay;
   a contact bounce time acquisition unit configured to obtain a contact bounce time indicated by the one pair of contacts based on a temporal change in the voltage value after an ON instruction to the relay; and
   a state determination unit configured to compare the contact bounce time with a time threshold value set in advance to determine whether or not the relay has deteriorated,
   wherein the contact bounce time acquisition unit detects a voltage region in which the voltage value is continuously zero V for a predetermined time after the ON instruction to the relay, in the voltage waveform, and
   the contact bounce time acquisition unit determines time from after the ON instruction to the relay to a beginning time point of the detected voltage region as the contact bounce time.

2. The relay state determination device according to claim 1, further comprising a notification unit configured to notify that the relay has deteriorated when it is determined that the contact bounce time is the time threshold value or more.

3. The relay state determination device according to claim 1, further comprising a time threshold value input unit for variably inputting the time threshold value.

4. A relay state determination system configured to determine whether or not a relay has deteriorated, the relay state determination system comprising:
   a relay including a coil on a primary side, and one pair of contacts on a secondary side configured to open and close by turning on and off energization of the coil on the primary side;
   a voltmeter configured to measure a voltage value between the one pair of contacts of the relay; and a relay state determination device communicably connected to the voltmeter, wherein the relay state determination device includes
- a voltage value acquisition unit configured to acquire the voltage value from the voltmeter,
- a contact bounce time acquisition unit configured to obtain a contact bounce time indicated by the one pair of contacts based on a temporal change in the voltage value after an ON instruction to the relay, and
- a state determination unit configured to compare the contact bounce time with a time threshold value set in advance to determine whether or not the relay has deteriorated, and wherein the contact bounce time acquisition unit detects a voltage region in which the voltage value is continuously zero V for a predetermined time after the ON instruction to the relay, in the voltage waveform, and the contact bounce time acquisition unit determines time from after the ON instruction to the relay to a beginning time point of the detected voltage region as the contact bounce time.

5. A relay state determination method for determining whether or not a relay of a type configured to open and close contacts on a secondary side by turning on and off energization of a coil on a primary side has deteriorated, the relay state determination method comprising:

acquiring a voltage value between one pair of contacts mutually opened and closed in the relay;

obtaining a contact bounce time indicated by the one pair of contacts based on a temporal change in the voltage value after an ON instruction to the relay; and comparing the contact bounce time with a time threshold value set in advance to determine whether or not the relay has deteriorated, wherein detecting a voltage region in which the voltage value is continuously zero V for a predetermined time after the ON instruction to the relay, in the voltage waveform, and determining time from after the ON instruction to the relay to a beginning time point of the detected voltage region as the contact bounce time.

* * * * *